US012455249B2

United States Patent
Yamamoto

(10) Patent No.: US 12,455,249 B2
(45) Date of Patent: Oct. 28, 2025

(54) SAMPLE STAGE AND OPTICAL INSPECTION DEVICE

(71) Applicant: Hitachi High-Tech Corporation, Tokyo (JP)

(72) Inventor: Masaya Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 734 days.

(21) Appl. No.: 17/761,933

(22) PCT Filed: Oct. 8, 2019

(86) PCT No.: PCT/JP2019/039712
§ 371 (c)(1),
(2) Date: Mar. 18, 2022

(87) PCT Pub. No.: WO2021/070265
PCT Pub. Date: Apr. 15, 2021

(65) Prior Publication Data
US 2022/0373479 A1     Nov. 24, 2022

(51) Int. Cl.
*H01L 21/67* (2006.01)
*B23Q 3/00* (2006.01)
(Continued)

(52) U.S. Cl.
CPC ............ *G01N 21/956* (2013.01); *B23Q 3/00* (2013.01); *G01N 21/9501* (2013.01);
(Continued)

(58) Field of Classification Search
CPC ........... H01L 21/67742; H01L 21/6838; H01L 21/68707; H01L 21/68764; H01L 21/68742
See application file for complete search history.

(56) References Cited

U.S. PATENT DOCUMENTS

| 4,559,718 A | 12/1985 | Tadokoro |
| 9,905,454 B2 * | 2/2018 | Ishii ................. H01L 21/68742 |

(Continued)

FOREIGN PATENT DOCUMENTS

| JP | 60-32324 A | 2/1985 |
| JP | 63-142829 A | 6/1988 |

(Continued)

OTHER PUBLICATIONS

International Search Report (PCT/ISA/210) issued in PCT Application No. PCT/JP2019/039712 dated Nov. 19, 2019 with English translation (four (4) pages).

(Continued)

*Primary Examiner* — Tyrone V Hall, Jr.
(74) *Attorney, Agent, or Firm* — Crowell & Moring LLP

(57) ABSTRACT

In this sample stage that adsorbs and holds a sample, the configuration includes: an outer circumference stage that has a first adsorption surface and a pressure receiving chamber that is a recess formed in the center thereof; an inner circumference stage that has a second adsorption surface, and that is housed in the pressure receiving chamber and can project upward from the outer circumference stage; a first flow channel for a sample desorption operation that is formed on the outer circumference stage and is opened on the first adsorption surface; a second flow channel for the sample desorption operation that is formed on the outer circumference stage and the inner circumference stage and is opened on the second adsorption surface; and a third flow channel for inner circumference stage elevating driving that is formed on the outer circumference stage and is opened in the pressure receiving chamber.

11 Claims, 7 Drawing Sheets

(51) Int. Cl.
*G01N 21/95* (2006.01)
*G01N 21/956* (2006.01)
*H01L 21/683* (2006.01)
*H01L 21/687* (2006.01)

(52) U.S. Cl.
CPC .. *H01L 21/67253* (2013.01); *H01L 21/67288* (2013.01); *H01L 21/6838* (2013.01); *H01L 21/6875* (2013.01)

(56) References Cited

U.S. PATENT DOCUMENTS

| | | | |
|---|---|---|---|
| 2005/0011460 | A1 | 1/2005 | Taniguchi |
| 2007/0268484 | A1 | 11/2007 | Matsui |
| 2019/0366517 | A1* | 12/2019 | Grund ................ H01L 21/6875 |
| 2020/0006103 | A1* | 1/2020 | Watanabe ............ H01L 21/681 |

FOREIGN PATENT DOCUMENTS

| | | | |
|---|---|---|---|
| JP | 63-115214 U | | 7/1988 |
| JP | 3-41935 U | | 4/1991 |
| JP | 4-5646 U | | 1/1992 |
| JP | H045646 U | * | 1/1992 |
| JP | 5-301137 A | | 11/1993 |
| JP | H1086086 A | * | 9/1996 |
| JP | 2004-253756 A | | 9/2004 |
| JP | 2005-116842 A | | 4/2005 |
| JP | 2007-309713 A | | 11/2007 |
| WO | WO 03/071599 A1 | | 8/2003 |

OTHER PUBLICATIONS

Japanese-language Written Opinion (PCT/ISA/237) issued in PCT Application No. PCT/JP2019/039712 dated Nov. 19, 2019 (three (3) pages).

* cited by examiner

SAMPLE STAGE AND OPTICAL INSPECTION DEVICE

TECHNICAL FIELD

The present invention relates to a sample stage that adsorbs and holds a sample such as a wafer and an optical inspection device having the same.

BACKGROUND ART

In the semiconductor manufacturing process, the influence of a defect (scratches, particles, etc.) of a sample such as a wafer on the yield rate is large and from the viewpoint of yield rate management it is important to feed the sample defect inspection information back to the semiconductor manufacturing process and the manufacturing equipment. The defect inspection device that performs in-line inspection of a sample such as a wafer plays an important role in the semiconductor manufacturing process. For example, by comparing the sample inspection results in various stages of the manufacturing process, which process device is a source of contamination and the like can be checked for management. For a wafer maker, inspection of a bare wafer itself is a product quality inspection.

As a kind of defect inspection device, there is an optical inspection device based on the Rθ method that moves the sample stage in the radial direction while rotating it and scans the sample (Patent Literature 1, etc.). From the viewpoint of scanning the sample in a short time (scanning the sample at high speed), the Rθ method optical inspection device is more advantageous than the XY method (step-and-repeat method) that moves the sample stage in the XY direction in parallel since it does not involve reciprocating movement.

CITATION LIST

Patent Literature

Patent Literature 1: Japanese Patent Application Laid-Open No. 2007-309713

SUMMARY OF INVENTION

Technical Problem

In the optical inspection device, a certain type of transfer device that transfers the sample with respect to the sample stage adsorbs (sucks) the center of the sample with a long thin linear arm from back to support it. If this type of transfer device is used, it is necessary to make a groove in the sample stage to avoid interference with the arm in order to place the sample on the sample stage or return the arm to its waiting position. For this reason, an Rθ method optical inspection device, in which the sample stage rotates and the orientation of the groove thus changes, is usually not adopted.

In the Rθ method optical inspection device, a fork-shaped arm with two claws is often used. The outer edge of the sample is supported with the two claws of the arm from back so that the sample is placed on the sample stage or lifted. The outside diameter of the sample stage is smaller than the distance between the two claws of the arm, so the sample stage does not interfere with the movement of the arm regardless of the angle.

However, when the two claws support the outer edge of the back of the sample to transport the sample, a space to move the claws from or to the sample stage after loading the sample on the sample stage or unloading it is required and thus the outside diameter of the sample stage must be smaller than the distance between the two claws. Therefore, the outside diameter of the sample stage should be smaller than the outside diameter of the sample and the sample stage cannot adsorb and support the outer circumference of the sample. In Rθ method optical inspection devices, the rotation speed of the sample stage during inspection tends to be increased for the purpose of shortening the inspection time, so the centrifugal force may cause undulation of the outer circumference of the sample that has not been adsorbed and fixed on the sample stage during inspection. In addition, in the semiconductor field in which miniaturization is in rapid progress, the demand for higher defect detection sensitivity is strong and there is a growing tendency toward short-wavelength inspection light and verry shallow focal depth. Therefore, undulation of the outer circumference of the sample might cause the inspection surface to be out of the focal depth, resulting a decline in inspection accuracy.

The object of the present invention is to provide a sample stage that improves the flatness of the sample during high speed rotation and increases the inspection sensitivity and an optical inspection device having the same.

Solution to Problem

In order to achieve the above object, the present invention provides a sample stage that adsorbs and holds a sample and includes: an outer circumference stage that has a first adsorption surface and a pressure receiving chamber as a recess formed in its center; an inner circumference stage that has a second adsorption surface and that is housed in the pressure receiving chamber and can project upward from the outer circumference stage; a first flow channel for sample loading/unloading operation that is formed in the outer circumference stage and is open into the first adsorption surface; a second flow channel for sample loading/unloading operation that is formed in the outer circumference stage and the inner circumference stage and is open into the second adsorption surface; and a third flow channel for inner circumference stage elevating driving that is formed in the outer circumference stage and is open into the pressure receiving chamber.

Advantageous Effects of Invention

According to the present invention, the flatness of the sample during high speed rotation can be improved and the inspection sensitivity can be increased.

DESCRIPTION OF EMBODIMENTS

Hereinafter, embodiments of the present invention will be described referring to drawings.

First Embodiment

<Optical Inspection Device>

Figure 1:
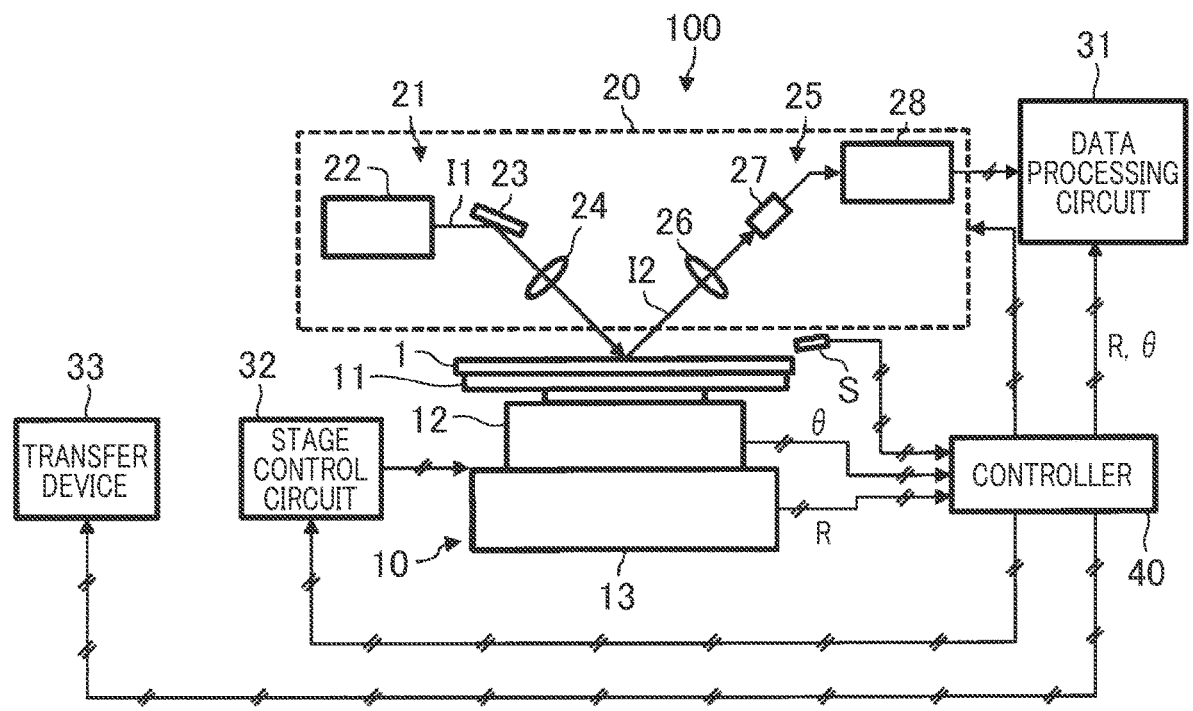
FIG. 1 is a schematic diagram of an optical inspection device according to a first embodiment of the present invention.
Figure 2:
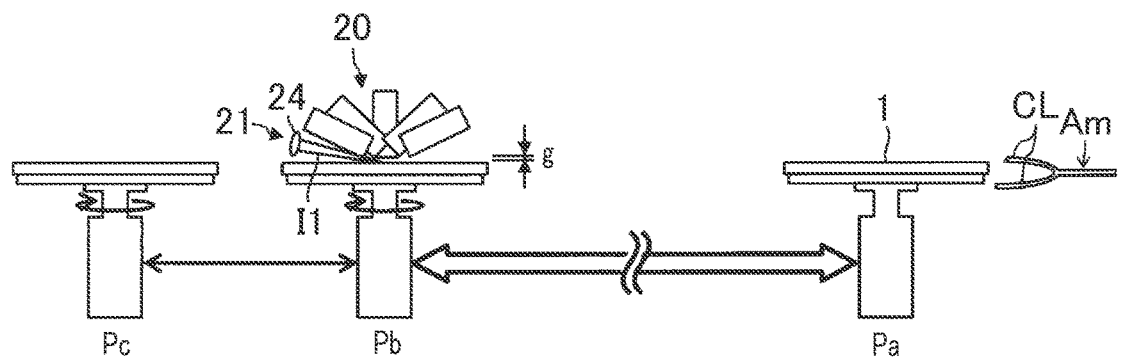
FIG. 2 is a schematic diagram that indicates the route of movement of the sample in the optical inspection device in FIG. 1.
Figure 3:
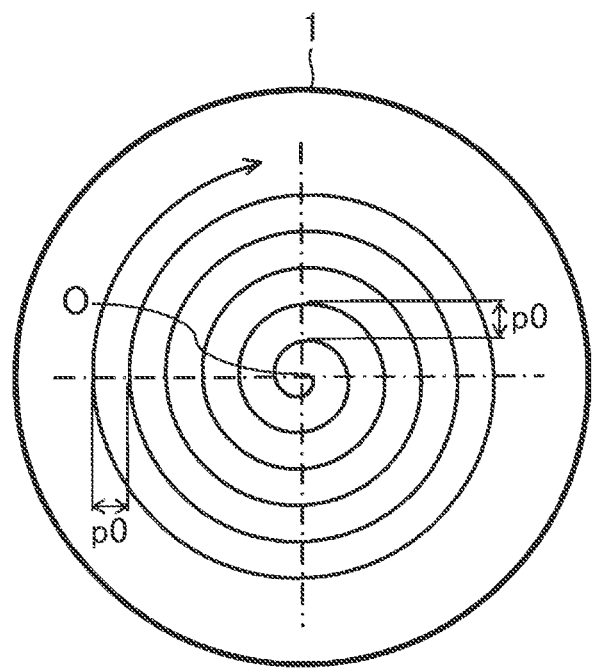
FIG. 3 is a plan view of the sample that schematically illustrates the trajectory of sample scanning by the optical inspection device in FIG. 1.

FIG. 1 is a schematic diagram of an optical inspection device according to the first embodiment of the present invention and FIG. 2 is a schematic diagram that shows the route of movement of a sample in the optical inspection device in FIG. 1. FIG. 3 is a plan view of the sample that schematically illustrates the trajectory of sample scanning by the optical inspection device in FIG. 1. The optical inspection device 100 shown in these figures is a defect inspection device based on the Rθ method that inspects the sample 1 for a defect by irradiating the moving and rotating sample 1 with illumination light I1 and scanning the sample 1 spirally or concentrically. The sample 1 is assumed to be a disk-shaped object, for example, a wafer (including a wafer in the various stages of the semiconductor manufacturing process, such as a bare wafer, wafer with a film, wafer with bumps, and patterned wafer). Defects that are detected by the optical inspection device 100 are scratches and undulation of the sample 1, particles adhering to the sample 1 and the like. The optical inspection device 100 includes a stage device 100, an illumination detection unit 20, a data processing circuit 31, a stage control circuit 32, a transfer device 33, and a controller 40. These components will be described sequentially.

—Stage Device

The stage device 10 includes a sample stage 11, a rotary stage 12, and a parallel movement stage 13.

The sample stage 11 is an inspection table that holds the sample 1 such as a wafer horizontal. The sample stage 11 according to this embodiment holds the sample 1 by adsorbing the back surface of the sample 1, though the structure of the sample stage 11 will be explained later. As shown in FIG. 1, the optical inspection device 100 includes a sensor S that detects the height (height relative to the illumination detection unit 20) of the sample 1 held on the sample stage 11 (for example, illumination point of the illumination light I1). For the sensor S, for example, an optical or supersonic contactless displacement sensor may be used. The sensor S can also measure the degree of warpage of the sample 1 (which will be explained later).

The rotary stage 12 is a stage that supports the sample stage 11 and autorotates around a vertical rotation axis (not shown) to rotate the sample 1 together with the sample stage 11. The rotary stage 12 includes an optical reading rotary encoder (not shown) and the rotation angle (θ coordinate) of the rotary stage 12 is detected by the rotary encoder and sent to the controller 40. However, the θ coordinate detector is not limited to a rotary encoder and any sensor that can detect the rotation angle accurately may be adopted instead of the rotary encoder.

The parallel movement stage 13 is a stage that supports the rotary stage 12 and moves in parallel along a rail (not shown) extending in the radial direction (R axis direction) of the rotary stage 12 and, along with the rotary stage 12 and the sample stage 11, it moves the sample 1 linearly in the horizontal direction. The parallel movement stage 13 includes an optical reading linear encoder (not shown) and the position (R coordinate) of the parallel movement stage 13 on the R axis is detected by the linear encoder and sent to the controller 40. However, the R coordinate detector is not limited to a linear encoder and any sensor that can detect a position on a line accurately may be adopted instead of the linear encoder.

In this embodiment, a sample delivery position Pa, inspection start position Pb, and inspection completion position Pc are set on the R axis and the parallel movement stage 13 is driven so that the rotary stage 12 moves along the line including these positions. The inspection start position Pb is a position at which the sample 1 is irradiated with the illumination light I1 and inspection is started. In this embodiment, it is a position at which a specific point (in this embodiment, center O (FIG. 3)) of the sample 1 coincides with the focal position of the illumination light I1 from the illumination detection unit 20. The inspection completion position Pc is a position at which inspection of the sample 1 is completed. In this embodiment, it is a position at which the outer edge of the sample 1 coincides with the focal position of the illumination light I1 from the illumination detection unit 20. The sample delivery position Pa is a position at which movement of the sample 1 to the inspection start position Pb is started. In this embodiment, it also serves as a position at which the sample 1 is loaded or unloaded with respect to the sample stage 11 by an arm Am (FIG. 2). The sample delivery position Pa is away from the focal position of the illumination light I1 from the illumination detection unit 20 so that the sample 1 on the sample stage 11 does not overlap the focal position of the illumination light I1 from the illumination detection unit 20.

—Illumination Detection Unit

The illumination detection unit 20 includes an illumination optical system 21 and a detection optical system 25. The illumination optical system 21 is a unit that irradiates the sample 1 with illumination light I1 and includes an illumination light source 22, a mirror 23, and an irradiating lens 24. The detection optical system 25 is a unit that detects inspection light I2 scattered or reflected by the sample 1 and includes a condensing lens 26, a light detector 27, and a detection circuit 28. For the convenience of explanation, the light from the light source that irradiates the sample is expressed as illumination light I1 and the light that is scattered or reflected by the sample and detected by the detection optical system is expressed as inspection light I2, but instead, these may be collectively referred to as "light".

In order to increase the inspection sensitivity, the illumination detection unit 20 should be nearer to the sample 1 (FIG. 2). With the demand for higher sensitivity inspection devices in the recent years, the distance between the illumination detection unit 20 and the sample is becoming shorter and when the sample stage 11 is positioned immediately under the illumination detection unit 20, gap g between the sample stage 11 and the illumination detection unit 20 is several millimeters or less. Therefore, it is difficult for the arm Am to move the sample 1 and insert it into the gap g to place it on the sample stage 11.

In FIG. 2, the illumination optical system 21 is located opposite to the sample delivery position Pa with the inspection start position Pb between them and the sample 1 is irradiated with the illumination light I1 obliquely from the opposite side of the sample delivery position Pa. One reason for this is to arrange the illumination optical system 21 in a manner to keep away from the working space for loading and unloading the sample 1, and reduce the distance between the sample delivery position Pa and the inspection start position Pb. The illumination light source 22 includes a shutter (not shown) and irradiates the sample 1 with the illumination light I1 (laser light in this embodiment) or blocks the illumination light I1 by opening or closing the shutter. As the shutter opens, the illumination light I1 emitted from the illumination light source 22 irradiates the sample 1 through the mirror 23 and irradiating lens 24. As the sample 1 held by the stage device 10 moves while rotating, as shown in FIG. 3 the illumination light I1 irradiates the sample 1, forming a spiral trajectory from the center O of the sample 1 to its outer edge and the entire surface of the sample 1 is thus inspected. The scanning trajectory of the illumination light I1 forms a spiral with pitch p0 (FIG. 3) as the controller 40 controls the moving speed of the parallel movement stage 13 according to the rotation speed of the rotary stage 12. The inspection light I2 scattered or reflected by the sample 1 is detected through the condensing lens 26, light detector (for example, photoelectric sensor) 27 and detection circuit 28 and the detection result is sent from the detection circuit 28 to the data processing circuit 31.

—Data Processing Circuit

In the data processing circuit 31, scan information (inspection result) is generated from the detection result by the illumination detection unit 20 and the Rθ coordinates entered from the controller 40. The scan information generated in the data processing circuit 31 includes the position, size, shape, etc. of defects such as particles and scratches.

—Stage Control Circuit

The stage control circuit 32 is a circuit that controls operation of the stage device 10 and includes, for example, a motor driver to drive the drive device (motor) of the rotary stage 12, a motor driver to drive the drive device (motor) of the parallel movement stage 13 and the like. As a command value for operation of the stage device 10 is entered from the controller 40, the stage control circuit 32 drives the drive device according to the command from the controller 40 so that the rotary stage 12 or parallel movement stage 13 is operated.

—Transfer Device

The transfer device 33 is a device that transfers the sample 1 with respect to the sample stage 11. The transfer device 33 includes a multi-joint arm Am. For example, the transfer device 33 picks up the sample 1 from a pod (not shown) set in the optical inspection device 100 and loads it on the sample stage 11 or takes out the sample 1 from the sample stage 11 and puts it in the pod. As shown in FIG. 2, the tip of the arm Am has a fork shape with two claws CL (U shape in this example) and the transfer device 33 supports the outer edge of the sample 1 from back with the two claws CL and transfers the sample 1 from the pod to the sample stage 11 or from the sample stage 11 to the pod.

<Sample Stage>

Figure 4:
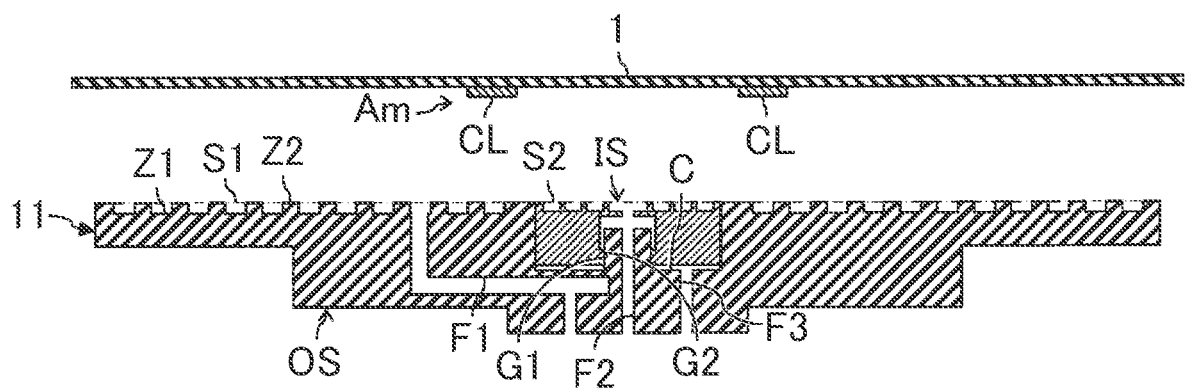
FIG. 4 is a sectional view of the sample stage of the optical inspection device in FIG. 1, including the rotation center.

FIG. 4 is a sectional view of the sample stage 11, including the rotation center. As shown in the figure, the sample stage 11 includes an outer circumference stage OS, an inner circumference stage IS, a first flow channel F1, a second flow channel F2, and a third flow channel F3.

—Outer Circumference Stage

The outer circumference stage OS is a single disk-shaped member that has a first adsorption surface S1 and a pressure receiving chamber C. The first adsorption surface S1 is an upward oriented surface (upper surface of the outer circumference stage OS) that adsorbs the back surface of the sample 1. In this embodiment, there are many (a plurality of) concave parts Z1 and convex parts Z2 on the upper surface of the outer circumference stage OS and the horizontal plane (chain line) tangent to the tops of the many convex parts Z2 forms the first adsorption surface S1. The shapes of the convex parts Z1 and convex parts Z2 are not limited. The concave parts Z1 and convex parts Z2 are, for example, uniformly distributed on the first adsorption surface S1 respectively. The concave parts Z1 and convex parts Z2 may be arranged concentrically in a repetitive pattern, for example, cylindrical concave parts Z1 or convex parts Z2 may be arranged geometrically in a repetitive pattern. The pressure receiving chamber C is a cylindrical chamber formed by concaving the center of the first adsorption surface S1. Since the pressure receiving chamber C is formed in the center, the first adsorption surface S1 is doughnut-shaped. In addition, the outer circumference stage OS includes a cylindrical guide G1 that extends vertically in the center of the pressure receiving chamber C. The guide G1 extends upward from the bottom of the pressure receiving chamber C to the middle portion of the pressure receiving chamber C and a gap is kept between the upper surface of the guide G1 and the adsorption surface.

—Inner Circumference Stage

The inner circumference stage IS is a single disk-shaped member that has a second adsorption surface S2. The outer circumference stage OS and inner circumference stage IS are concentrically formed in a plan view (namely, the adsorption surfaces S1 and S2 are concentric with each other). The outside diameter (diameter) of the inner circumference stage IS is smaller than the distance (inner size) between the two claws CL of the arm Am of the transfer device 33 and the outside diameter (diameter) of the outer circumference stage OS is larger than it. The outer size of the two claws CL is not larger than the diameter of the sample 1 and in this embodiment, it is not larger than the diameter of the outer circumference stage OS. The second adsorption surface S2 is an upward oriented surface (upper surface of the inner circumference stage IS) that adsorbs the back surface of the sample 1. Like the outer circumference stage OS, many (a plurality of) concave parts Z1 and convex parts Z2 are uniformly distributed on the upper surface of the inner circumference stage IS and the horizontal plane (chain line) tangent to the tops of the many convex parts Z2 forms the second adsorption surface S2. The inner circumference stage IS is housed in the pressure receiving chamber C of the outer circumference stage OS in a vertically movable manner and can project upward from the outer circumference stage OS. The range in which the inner circumference state IS moves up and down includes the height position for the outer circumference stage OS at which the adsorption surfaces S1 and S2 are flush and in this example, when the inner circumference stage IS is at the lower limit position, the adsorption surfaces S1 and S2 are flush. The height difference between the adsorption surfaces S1 and S2 with the inner circumference stage IS moved up is larger than the thickness of the claws CL of the arm Am in the vertical direction. A guide G2 is provided under the inner circumference stage IS. The guide G2 is a cylindrical concave part and slides over the guide G1 of the outer circumference stage OS along the guide G1 to guide the ascending/descending motion of the inner circumference stage IS with respect to the outer circumference stage OS.

—First Flow Channel

The first flow channel F1 is a flow channel for sample loading/unloading operation to load or unload the sample 1 on the adsorption surface S1 by sucking a gas (for example, air) from the adsorption surface S1 of the outer circumference stage OS or injecting a gas. The first flow channel F1 is formed in the outer circumference stage OS, in which one end is open into the first adsorption surface S1 and the other end is open into the lower surface of the outer circumference stage OS. An opening of the first flow channel F1 in the first adsorption surface S1 is open into the concave parts Z1. Although illustrated in a simplified manner in FIG. 4, the first flow channel F1 has a plurality of openings in the first adsorption surface F1 and these openings are arranged rotationally symmetrically with respect to the center of the second adsorption surface (namely, the rotation center of the sample stage 11).

—Second Flow Channel

The second flow channel F2 is a flow channel for sample loading/unloading operation to load or unload the sample 1 on the adsorption surface S2 by sucking a gas (for example, air) from the adsorption surface S2 of the inner circumference stage IS or injecting a gas. The second flow channel F2 is formed in the outer circumference stage OS and inner circumference stage IS and in this embodiment, it includes a flow channel running vertically in the center of the outer circumference stage OS (namely, the center of the guide G1) and a flow channel running vertically in the center of the inner circumference stage IS. One end of the second flow channel F2 is open into the center of the second adsorption surface S2 and the other end is open into the lower surface of the outer circumference stage OS. An opening of the second flow channel F2 in the second adsorption surface S2 is open into the concave parts Z1. Although illustrated in a simplified manner in FIG. 4, the second flow channel F2 has at least one opening in the second adsorption surface S2 and at least one opening is arranged rotationally symmetrically with respect to the center of the second adsorption surface (namely, the rotation center of the sample stage 11). In this embodiment, an example that the second flow channel F2 has only one opening in the rotation center of the sample stage 11 is given.

—Third Flow Channel

The third flow channel F3 is a flow channel for inner circumference stage elevating to move up and down the inner circumference stage IS by taking in or out a gas (for example, air) with respect to the pressure receiving chamber C. The third flow channel F3 is formed in the outer circumference stage OS, in which one end is open into the bottom of the pressure receiving chamber C and the other end is open into the lower surface of the outer circumference stage OS.

Supplementary information about the diameter of the inner circumference stage IS is given below. First of all, the diameter of the outer circumference stage OS is adjusted to the diameter of the sample 1 as the object of inspection for the optical inspection device 100. However, for notch detection of the sample 1, the outer edge of the sample 1 must project slightly (for example, 1 mm or so) outside the sample stage 11. In addition, in consideration of an error in setting the sample 1 onto the sample stage 11 by the transfer device 33 (for example, a maximum of 0.5 mm or so), actually the outer circumference stage OS is made smaller than the sample 1 by about 2 mm in radius.

Here, the diameter of the sample 1 is 300 mm and the rotary stage 12 rotates at several thousands of revolutions per minute during scanning. A circumstance in which the sample 1 is largely warped and adsorbed only by the adsorption surface S2 of the inner circumference stage IS and the sample 1 is 0.5 mm decentered with respect to the sample stage 11 is assumed. In this case, in order to support the inertia force exerted on the sample 1 when the sample stage 11 rotating at the maximum rotating speed is stopped in an emergency, according to the analysis made by the present inventor, the inner circumference stage IS must have a diameter of about 100 mm in consideration of safety factor as appropriate. Even when the diameter of the sample stage 11 is changed according to the size of the sample 1, proportional calculation can be applied and thus the lower limit of the diameter of the inner circumference stage IS is preferably about ⅓ of the diameter of the outer circumference stage OS. As for the upper limit of the diameter of the inner circumference stage IS, the value obtained by subtracting the total of widths of the two claws CL of the arm Am from the diameter of the outer circumference stage OS may be adequate.

<Pneumatic System>

Figure 5:
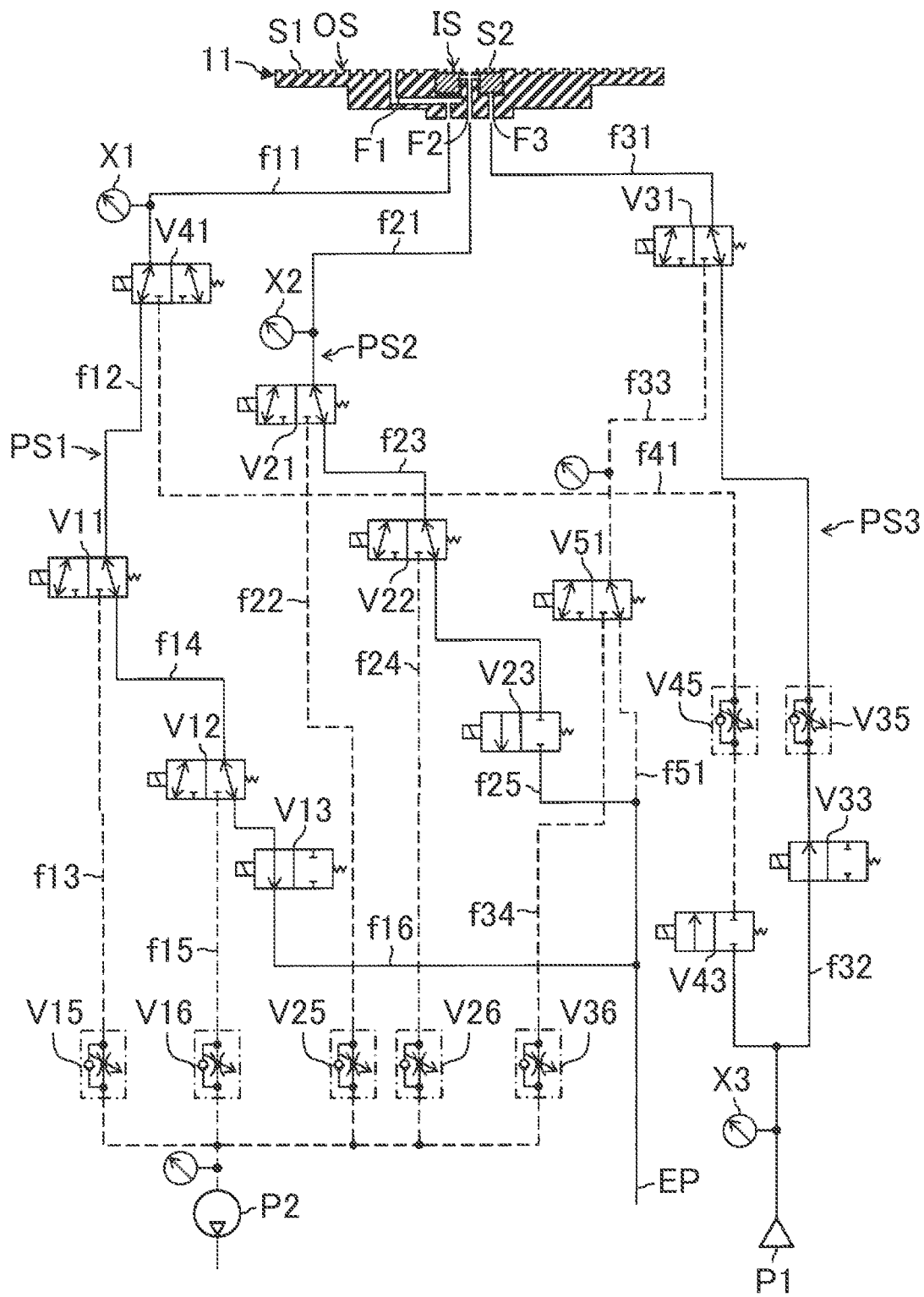
FIG. 5 is a pneumatic circuit diagram of the pneumatic system of the optical inspection device in FIG. 1.

FIG. 5 is a pneumatic circuit diagram of the pneumatic system of the optical inspection device according to this embodiment. The optical inspection device 100 includes a pneumatic system for sample loading/unloading operation that drives the sample stage 11. The pneumatic system shown in the figure includes an air supply pump P1, an intake pump P2, an exhaust port EP, a first piping system PS1, a second piping system PS2, a third piping system PS3, and control valves. The control valves include direction switch valves V11, V12, V21, V22, V31, V41 and V51, cutoff valves V13, V23, V33, and V43, and flow rate regulating valves V15, V16, V25, V26, V35, V36, and V45.

—Pumps, Etc.

The air supply pump P1 is a fluid machine (for example, compressor) that supplies a gas to the object to be connected to pressurize it. The intake pump P2 is a fluid machine (for example, vacuum pump) that sucks the gas from the object to be connected to reduce the pressure. The exhaust port EP is a pipe whose end is open into the atmospheric air (for example, pipe or pipe joint such as a hose).

—Piping Systems

The first piping system PS1 is connected to the first flow channel F1 of the sample stage 11, the second piping system PS2 is connected to the second flow channel F2, and the third piping system PS3 is connected to the third flow channel F3 independently. Next, the piping systems PS1 to PS3 will be explained in detail sequentially.

The first piping system PS1 is a gas flow channel for sample loading/unloading operation on the first adsorption surface S1 and includes a plurality of connected pipes (for example, hoses) and connects the intake pump P2 and exhaust port EP with the first flow channel F1 of the sample stage 11. By controlling the flowing direction and flow rate of the gas that flows in this piping system PS1, the sample 1 is loaded or unloaded by the first adsorption surface S1. The first piping system PS1 includes pipes f11 to f16. One end of the pipe f11 is connected to the first flow channel F1 and the other end is connected to one end of the pipes f12 and f41 through the direction switch valve V41. One end of the pipe f12 is connected to the direction switch valve V41 and the other end is connected to the pipes f13 and f14 through the direction switch valve V11. One end of the pipe f13 is connected to the direction switch valve V11 and the other end is connected to the intake pump P2. One end of the pipe f14 is connected to the direction switch valve V11 and the other end is connected to the pipes f15 and f16 through the direction switch valve V12. One end of the pipe f15 is connected to the direction switch valve V12 and the other end is connected to the intake pump P2. One end of the pipe f16 is connected to the direction switch valve V12 and the other end is connected to the exhaust port EP. One end of the pipe f41 is connected to the direction switch valve V41 and the other end is connected to the air supply pump P1.

The second piping system PS2 is a gas flow channel for sample loading/unloading operation on the second adsorption surface S2 and includes a plurality of connected pipes (for example, hoses) and connects the intake pump P2 and exhaust port EP with the second flow channel F2 of the sample stage 11. By controlling the flowing direction and flow rate of the gas that flows in this piping system PS2, the sample 1 is loaded or unloaded by the second adsorption surface S2. The second piping system PS2 includes pipes f21 to f25. One end of the pipe f21 is connected to the second flow channel F2 and the other end is connected to the pipes f22 and f23 through the direction switch valve V21. One end of the pipe f22 is connected to the direction switch valve V21 and the other end is connected to the intake pump P2. One end of the pipe f23 is connected to the direction switch valve V21 and the other end is connected to the pipes f24 and f25 through the direction switch valve V22. One end of the pipe f24 is connected to the direction switch valve V22 and the other end is connected to the intake pump P2. One end of the pipe f25 is connected to the direction switch valve V22 and the other end is connected to the exhaust port EP.

The third piping system PS3 is a gas flow channel for elevating the inner circumference stage IS and includes a plurality of connected pipes (for example, hoses) and connects the air supply pump P1 and intake pump P2 with the third flow channel F3 of the sample stage 11. By controlling the flowing direction and flow rate of the gas that flows in this piping system PS3, the inner circumference stage IS is moved up and down with respect to the outer circumference stage OS. The piping system PS3 includes pipes f31 to f34. One end of the pipe f31 is connected to the third flow channel F3 and the other end is connected to the pipes f32 and f33 through the direction switch valve V31. One end of the pipe f32 is connected to the direction switch valve V31 and the other end is connected to the air supply pump P1. One end of the pipe f33 is connected to the direction switch valve V31 and the other end is connected to the pipes f34 and f51 through the direction switch valve V51. One end of the pipe f34 is connected to the direction switch valve V51 and the other end is connected to the intake pump P2. One end of the pipe f51 is connected to the direction switch valve V51 and the other end is connected to the exhaust port EP.

The pipes f11, f21, and f31 of the piping systems PS1 to PS3 are connected to the flow channels F1 to F3 of the sample stage 11, for example, through swivel joints (not shown) respectively, which allows rotary movement of the sample stage 11 by the rotary stage 12. The optical inspection device 100 also includes pressure sensors X1 to X3. The pressure sensor X1 mainly performs the function to detect the pressure of the first flow channel F1 and in this embodiment, it is installed in the pipe f11. The pressure sensor X2 mainly performs the function to detect the pressure of the second flow channel F2 and in this embodiment, it is installed in the pipe f21. The pressure sensor X3 mainly performs the function to detect the pressure of the third flow channel F3 (pressure receiving chamber C) and in this embodiment, it is installed in the discharge pipe of the air supply pump P1.

—Control Valves

The control valves are a plurality of control valves that control the gas flowing in the piping systems PS1 to PS3. As mentioned above, the control valves include direction switch valves V11, V12, V21, V22, V31, V41 and V51, cutoff valves V13, V23, V33, and V43, and flow rate regulating valves V15, V16, V25, V26, V35, V36, and V45. The cutoff valves V13, V23, V33, and V43 are electromagnetic cutoff valves and are installed in the pipes f16, f25, f32, and f41 respectively and open or close the flow channels of the pipes f16, f25, f32, and f41. The flow rate regulating valves V15, V16, V25, V26, and V36 are installed in the pipes f13, f15, f22, f24, and f34 connected to the intake pump P2 respectively and regulate the flow rate of the gas that flows in the pipes f13, f15, f22, f24, and f34. In this example, the flow rate set by the flow rate regulating valves V16, V26, and V36 is smaller than the flow rate set by the flow rate regulating valves V15 and V25. The flow rate regulating valves V35 and V45 are installed in the pipes f32 and f41 connected to the air supply pump P1 respectively and regulate the flow rate of the gas that flows in the pipes f32 and f41. In this example, the flow rate set by the flow rate regulating valve V45 is smaller than the flow rate set by the flow rate regulating valve V35.

The direction switch valves V11, V12, V21, V22, V31, V41 and V51 are electromagnetic 2-position switch valves, which are roughly classified into five types in terms of function.

A first direction switch valve performs the function to switch the object to be connected to the first flow channel F1 of the sample stage 11 between the intake pump P2 and the exhaust port EP. In this embodiment, the direction switch valves V11 and V12 that are installed in the first piping system SP1 correspond to the first direction switch valve. The direction switch valve V11 changes the object to be connected to the pipe f12 connected to the first flow channel F1 through the pipe f11 to either the pipe f13 connected to the intake pump P2 or the pipe f14 connected to the exhaust port EP through the pipe f16. The direction switch valve V12 changes the object to be connected to the pipe f14 connected to the first flow channel F1 through the pipes f11 and f12 to either the pipe f15 connected to the intake pump P2 or the pipe f16 connected to the exhaust port EP. By operating the direction switch valves V11 and V12 in combination, whether the intake pump P2 is connected to the first flow channel F1 either through the flow rate regulating valve V15 or through the flow rate regulating valve V16 can be changed. As mentioned above, different flow rates are set for the flow rate regulating valves V15 and V16. The reason that a plurality of direction switch valves V11 and V12 are used as the first direction switch valve is to switch the gas flow rate to reduce the pressure of the first flow channel F1 between high and low levels. If it is unnecessary to change the gas flow rate or if a proportional type direction switch valve with a flow rate control function is adopted, the first direction switch valve may be a single direction switch valve.

A second direction switch valve performs the function to switch the object to be connected to the second flow channel F2 of the sample stage 11 between the intake pump P2 and the exhaust port EP. In this embodiment, the direction switch valves V21 and V22 that are installed in the second piping system SP2 correspond to the second direction switch valve. The direction switch valve V21 changes the object to be connected to the pipe f21 connected to the second flow channel F2 to either the pipe f22 connected to the intake pump P2 or the pipe f23 connected to the exhaust port EP through the pipe f25. The direction switch valve V22 changes the object to be connected to the pipe f23 connected to the second flow channel F2 through the pipes f21 to either the pipe f24 connected to the intake pump P2 or the pipe f25 connected to the exhaust port EP. Like the first direction switch valve, by operating the direction switch valves V21 and V22 in combination, whether the intake pump P2 is connected to the second flow channel F2 either through the flow rate regulating valve V25 or through the flow rate regulating valve V26 can be changed. Different flow rates are set for the flow rate regulating valves V25 and V26. The reason that a plurality of direction switch valves V21 and V22 are used as the second direction switch valve is to switch the gas flow rate to reduce the pressure of the second flow channel F2 between high and low levels. If it is unnecessary to change the gas flow rate or if a proportional type direction switch valve with a flow rate control function is adopted, the second direction switch valve may be a single direction switch valve.

A third direction switch valve performs the function to switch the object to be connected to the third flow channel F3 of the sample stage 11 between the air supply pump P1 and the intake pump P2. In this embodiment, the direction switch valve V31 that is installed in the third piping system SP3 corresponds to the third direction switch valve. The direction switch valve V31 changes the object to be connected to the pipe f31 connected to the third flow channel F3 to either the pipe f32 connected to the air supply pump P1 or the pipe f33 connected to the exhaust port EP through the pipe f51.

A fourth direction switch valve performs the function to switch the object to be connected to the first flow channel F1 of the sample stage 11 between the intake pump P2 and the air supply pump P1. In this embodiment, the direction switch valve V41 corresponds to the fourth direction switch valve. The direction switch valve V41 changes the object to be connected to the pipe f11 connected to the first flow channel F1 to either the pipe f12 connected to the air supply pump P1 through the pipe f13 or the pipe f41 connected to the air supply pump P1.

A fifth direction switch valve performs the function to switch the object to be connected to the third flow channel F3 of the sample stage 11 between the intake pump P2 and the exhaust port EP. In this embodiment, the direction switch valve V51 corresponds to the fifth direction switch valve. The direction switch valve V51 changes the object to be connected to the pipe f33 connected to the third flow channel F3 through the pipe f31 to either the pipe f51 connected to the intake pump P2 or the pipe f51 connected to the exhaust port EP.

<Controller>

Figure 6:
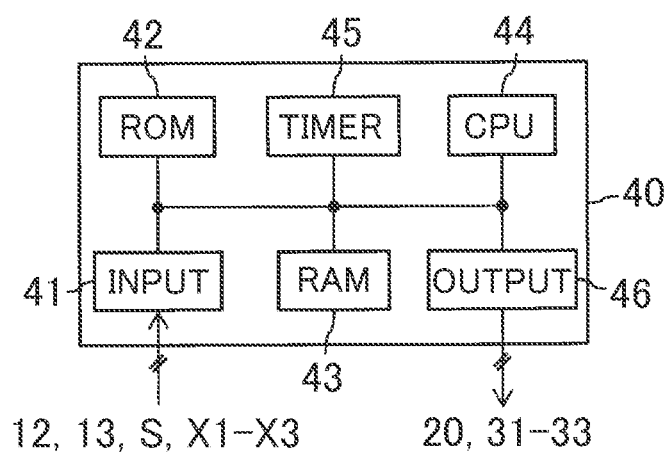
FIG. 6 is a schematic diagram of the hardware configuration of the controller of the optical inspection device in FIG. 1.

FIG. 6 is a schematic diagram of the hardware configuration of the controller 40. The controller 40 is a computer that controls operation of the stage device 10 (sample stage 11 (pneumatic system), rotary stage 12, and parallel movement stage 13), illumination detection unit 20, transfer device 33 and so on. The controller 40 includes an input interface 41, a ROM (for example, EPROM) 42, a RAM 43, a CPU 44, a timer 45, and an output interface 46 and so on.

The input interface 41 receives signals from the encoders of the rotary stage 12 and parallel movement stage 13, sensor S and pressure sensors X1 to X3 and the inspection conditions entered from an input device (not shown) such as a keyboard according to operation by the operator. For example, the inspection conditions include the type, size, shape, material, etc. of the sample 1. The ROM 42 stores the arithmetic equations, programs and data that are required for defect inspection. The RAM 43 stores numerical values in the course of calculation, information on the inspection conditions, etc. entered from the input device, and so on. The output interface 46 outputs a command signal to the stage device 10 (stage control circuit 32, pneumatic system), the illumination detection unit 20, and the transfer device 33 according to a command from the CPU 44.

The CPU 44 performs prescribed processing on the basis of the information entered through the input interface 41 according to the program loaded from the ROM 42. For example, the CPU 44 outputs a command value to the stage device 10 and illumination detection unit 20 on the basis of the inspection conditions, Re coordinates of the sample stage 11 and the like and the rotary stage 12, parallel movement stage 13 and illumination detection unit 20 are driven to scan the sample 1. Furthermore, in loading and unloading the sample 1, the CPU 44 outputs a command value to the stage control circuit 32 and transfer device 33 on the basis of signals from the pressure sensors X1 to X3, etc. according to the program. The pneumatic system is driven by the controller 40 through the stage control circuit 32 and the transfer device 33 is driven by the controller 40 so that the sample 1 is loaded or unloaded with respect to the sample stage 11.

—Sample Loading/Unloading Operation—

Figure 7:
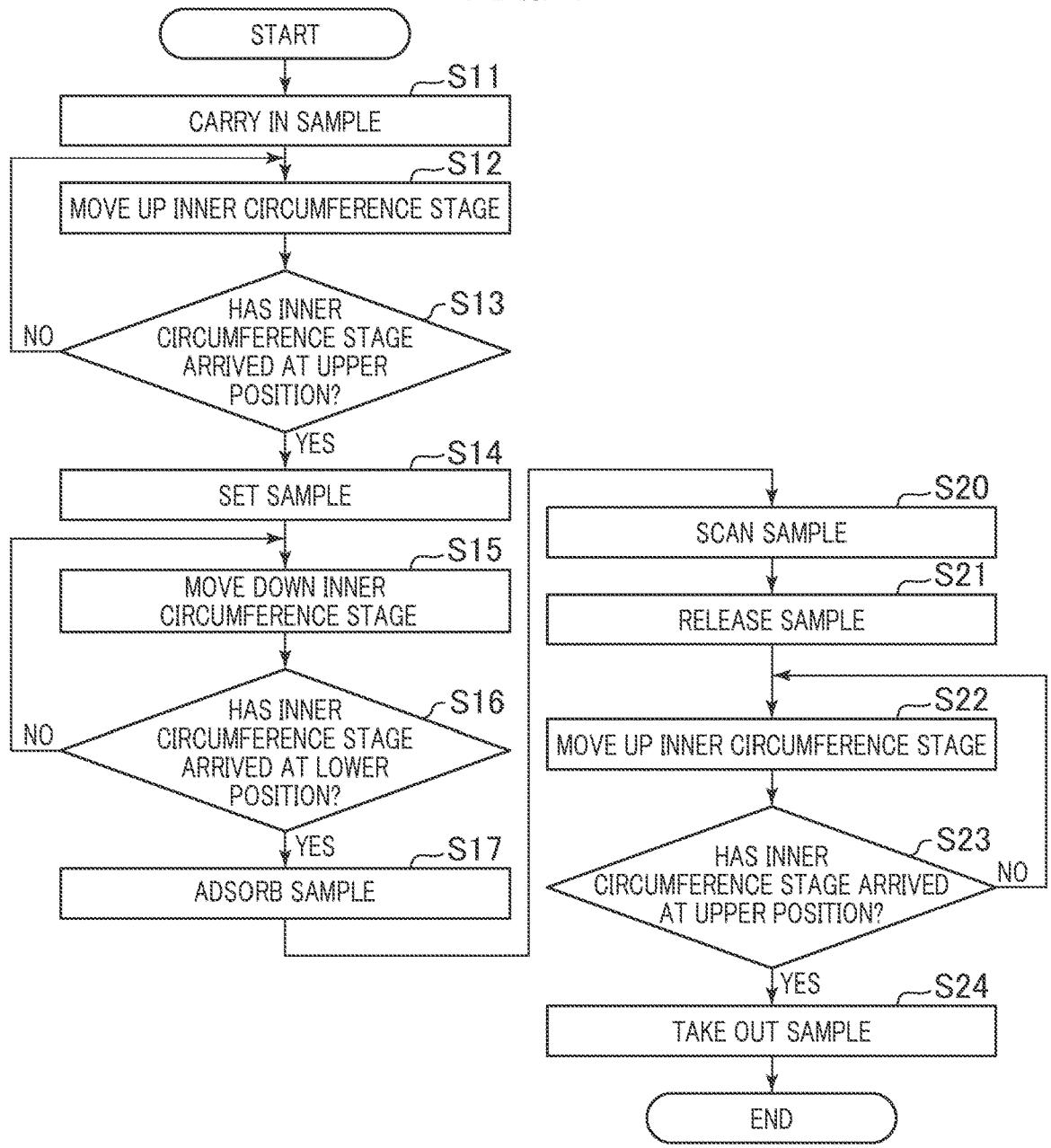
FIG. 7 is a flowchart that indicates the control sequence by the controller in FIG. 6, mainly concerning the sample loading/unloading operation of the optical inspection device.

FIG. 7 is a flowchart that indicates the control sequence by the controller, mainly concerning the sample loading/unloading operation of the optical inspection device. The control described below is performed when the CPU 44 outputs a command signal to the pneumatic system (control valves, air supply pump P1, and intake pump P2) and the transfer device 33. Among the following steps, Steps S11 to S17 are the sample loading steps that include the step of carrying in the sample, the step of moving up the inner circumference stage, the step of setting the sample, the step of moving down the inner circumference stage, and the step of adsorbing the sample. Also, Steps S21 to S24 are the sample unloading steps that include the step of releasing the sample, the step of moving up the inner circumference stage, the step of moving up the inner circumference stage, and the step of taking out the sample.

—Step S11 (Step of Carrying in the Sample)

The controller 40 first instructs the transfer device 33 to move the sample 1 picked up, for example, from the pod, using the arm Am to above the sample stage 11 waiting at the sample delivery position Pa. The pod is a case that houses the sample 1. The pod that houses the sample 1 is attached to a prescribed part of the optical inspection device 100 and the sample 1 is put into or taken out of the optical inspection device 100 by opening and closing the pod. A pre-aligner (not shown) may be provided in the sample moving route from the pod to the sample delivery position Pa and the transfer device 33 may move the sample 1 from the pre-aligner to above the sample stage 11 at the sample delivery position Pa.

Meanwhile, in the first piping system PS1, the direction switch valve V41 is switched to the left position in FIG. 5, the direction switch valves V11 and V12 are switched to the right position in the figure, and the cutoff valve V13 is switched to the open position to connect the first flow channel F1 of the sample stage 11 to the exhaust port EP. In the second piping system PS2, the direction switch valves V21 and V22 are switched to the right position in the figure and the cutoff valve V23 is switched to the open position to connect the second flow channel F2 of the sample stage 11 to the exhaust port EP, too. Also, in the third piping system PS3, the direction switch valve V31 is switched to the left position in the figure and the direction switch valve V51 is switched to the right position in the figure to connect the third flow channel F3 of the sample stage 11 to the exhaust port EP, too. The cutoff valves V33 and V43 are switched to the closed position. In this state, no air flow is generated in the flow channels F1 to F3 of the sample stage 11 and these flow channels have an atmospheric pressure and the adsorption surfaces S1 and S2 of the sample stage 11 become flush.

—Step S12 (Step of Moving Up the Inner Circumference Stage)

Figure 8:
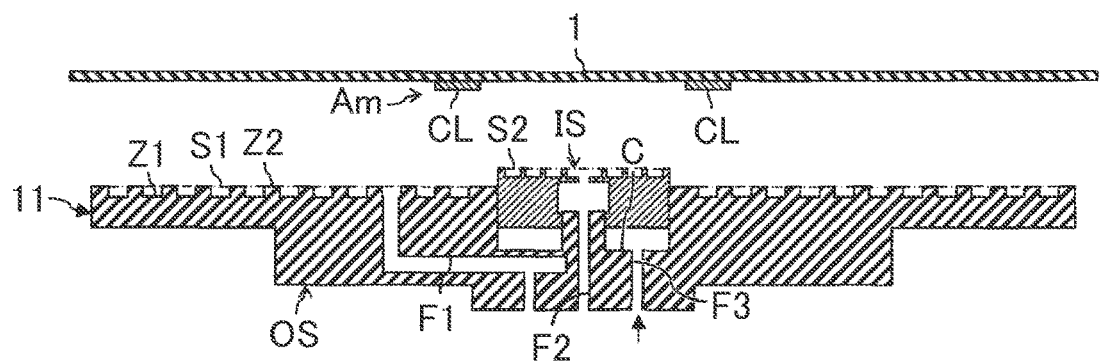
FIG. 8 is a view that shows the state of the sample stage in FIG. 4 at the step of moving up the inner circumference stage in the sample loading/unloading operation.

After the sample 1 is moved to above the sample stage 11, the controller 40 starts operation of the air supply pump P1 and intake pump P2 and instructs the control valves to move up the inner circumference stage IS with respect to the outer circumference stage OS (see FIG. 8). This step may be carried out while the sample 1 is being moved to above the sample stage 11. To move up the inner circumference stage IS, in the third piping system PS3 the cutoff valve V33 is switched to the open position and the direction switch valve V31 is switched to the right position in FIG. 5 to connect the third flow channel F3 of the sample stage 11 with the air supply pump P1 through the flow rate regulating valve V35 for larger flow rates. This pressurizes the pressure receiving chamber C and quickly moves up the inner circumference stage IS with respect to the outer circumference stage OS.

Meanwhile, in the first piping system PS1, the direction switch valve V41 is switched to the left position in FIG. 5, the direction switch valves V11 and V12 are switched to the right position in the figure, and the cutoff valve V13 is switched to the open position to connect the first flow channel F1 of the sample stage 11 to the exhaust port EP. In the second piping system PS2, the direction switch valves V21 and V22 are switched to the right position in the figure and the cutoff valve V23 is switched to the open position to connect the second flow channel F2 of the sample stage 11 to the exhaust port EP, too. The cutoff valve V43 is switched to the closed position. In this state, no air flow is generated in the flow channels F1 and F2 of the sample stage 11 and these flow channels still have an atmospheric pressure and sucking power is not generated on the adsorption surfaces S1 and S2 of the sample stage 11 yet. Although the direction switch valve V51 may be set to any position, in this case it is switched to the right position in FIG. 5 for connection to the exhaust port EP so that the pipes f33 and f51 have an atmospheric pressure.

—Step S13

After the inner circumference stage IS starts moving up, the controller 40 decides whether or not the inner circumference stage IS has arrived at the upper position (for example, the upper limit of the elevating range of the inner circumference stage IS). The controller 40 can make a decision as to whether the inner circumference stage IS has arrived at the upper position, for example, according to the height of the sample stage 11 measured by the sensor S. Also, when the increase in the volume of the pressure receiving chamber C with the ascent of the inner circumference stage IS stops and the pressure measured by the pressure sensor X3 exceeds a set value, it can be decided that the inner circumference stage IS has arrived at the upper position. The controller 40 continues Step S12 until the inner circumference stage IS arrives at the upper position and after the inner circumference stage IS arrives at the upper position, the sequence proceeds to the next step.

—Step S14 (Step of Setting the Sample)

Figure 9:
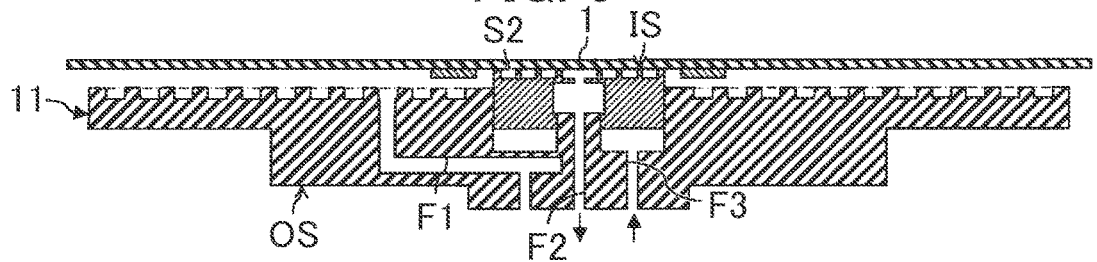
FIG. 9 is a view that shows the state of the sample stage in FIG. 4 at the step of setting the sample in the sample loading/unloading operation.

After the inner circumference stage IS moves up to the upper position, the controller 40 instructs the transfer device 33 to move down the arm Am and place the sample 1 on the inner circumference stage IS in a manner that its center coincides with the rotation center of the sample stage 11, to set the sample 1 on the inner circumference stage IS (see FIG. 9). At this step, in the third piping system PS3, the third flow channel F3 of the sample stage 11 remains connected with the air supply pump P1 to keep the inner circumference stage IS at the upper position. In the second piping system PS2, the direction switch valve V21 is switched to the left position in FIG. 5 to connect the second flow channel F2 of the sample stage 11 to the intake pump P2 through the flow rate regulating valve V25 for setting larger flow rates. This generates sucking power on the adsorption surface S2 of the inner circumference stage IS and adsorbs and fixes the sample 1 on the adsorption surface S2.

Meanwhile, in the first piping system PS1, the direction switch valve V41 is switched to the left position in FIG. 5, the direction switch valves V11 and V12 are switched to the right position in the figure, and the cutoff valve V13 is switched to the open position to connect the first flow channel F1 of the sample stage 11 to the exhaust port EP. Thus, the first flow channel F1 is connected to the exhaust port EP, the second flow channel F2 is connected to the intake pump P2, and the third flow channel F3 is connected to the air supply pump P1 so that the sample 1 is placed on the inner circumference stage IS projecting upward from the outer circumference stage OS and the sample 1 is adsorbed by the inner circumference stage IS.

Although the direction switch valve V22 and the cutoff valve V23 may be set to any position, in this case the direction switch valve V22 is switched to the right position in FIG. 5 and the cutoff valve V23 is switched to the open position for connection to the exhaust port EP so that the inner pressure of the pipes f23 and f25 is an atmospheric pressure. Although the cutoff valves V33 and V43 may be set to any position, in this case they are switched to the closed position to prevent the pipes downstream of the cutoff valves V33 and V43 from being pressurized.

—Step S15 (Step of Moving Down the Inner Circumference Stage)

Figure 10:
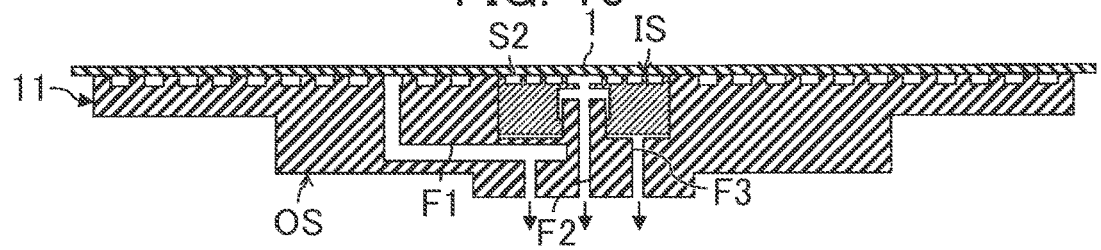
FIG. 10 is a view that shows the state of the sample stage in FIG. 4 at the step of moving down the inner circumference stage in the sample loading/unloading operation.

After the sample 1 is set on the inner circumference stage IS, the controller 40 instructs the control valves to connect the third flow channel F3 to the intake pump P2 and move down the inner circumference stage IS so that it is housed in the outer circumference stage OS (see FIG. 10). To move down the inner circumference stage IS, in the third piping system PS3 the direction switch valves V31 and V51 are switched to the left position in FIG. 5 to connect the third flow channel F3 of the sample stage 11 with the intake pump P2 through the flow rate regulating valve V36 for smaller flow rates. This gradually reduces the pressure of the pressure receiving chamber C and the inner circumference stage IS moves down with respect to the outer circumference stage OS.

Meanwhile, in the first piping system PS1, the direction switch valves V41 and V12 are switched to the left position in FIG. 5 and the direction switch valves V11 is switched to the right position in the figure to connect the first flow channel F1 of the sample stage 11 to the intake pump P2 through the flow rate regulating valve V16 for smaller flow rates. Consequently, at the step of moving down the inner circumference stage, the atmospheric air is taken into the first flow channel F1 from between the first adsorption surface S1 and the sample 1 approaching it. In the second piping system PS2, the direction switch valve V21 is switched to the right position in FIG. 5 and the direction switch valve V22 is switched to the left position in the figure to connect the second flow channel F2 of the sample stage 11 to the intake pump P2 through the flow rate regulating valve V26 for smaller flow rates. This reduces the adsorption force exerted on the sample 1 by the adsorption surface S2 of the inner circumference stage IS.

Although the cutoff valves V13 and V23 may be set to any position, in this case they are switched to the open position for connection to the exhaust port EP so that the pipes f16 and f25 have an atmospheric pressure. Although the cutoff valves V33 and V43 may be set to any position, in this case they are switched to the closed position to prevent the pipes downstream of the cutoff valves V33 and V43 from being pressurized.

—Step S16

After the inner circumference stage IS starts moving up, the controller 40 decides whether or not the inner circumference stage IS has arrived at the lower position (for example, the lower limit of the elevating range of the inner circumference stage IS) and the adsorption surfaces S1 and S2 are flush. The controller 40 can make a decision as to whether the inner circumference stage IS has arrived at the lower position, for example, according to the height of the sample stage 11 measured by the sensor S. Also, when the decrease in the volume of the pressure receiving chamber C with the descent of the inner circumference stage IS stops and the pressure measured by the pressure sensor X1 is below a set value, it can be decided that the inner circumference stage IS has arrived at the lower position. The controller 40 continues Step S15 until the inner circumference stage IS arrives at the lower position and after the inner circumference stage IS arrives at the lower position, the sequence proceeds to the next step.

—Step S17 (Step of Adsorbing the Sample)

After the inner circumference stage IS arrives at the lower position, the controller 40 instructs the control valves to connect the flow channels F1 and F2 to the intake pump P2 so that the sample 1 is adsorbed and held by the adsorption surfaces S1 and S2.

In this embodiment, in the first piping system PS1, the direction switch valves V41 and V11 are switched to the left position in FIG. 5 to connect the first flow channel F1 of the sample stage 11 to the intake pump P2 through the flow rate regulating valve V15 for larger flow rates. Consequently, strong sucking power is generated on the adsorption surface S1 of the outer circumference stage OS and the sample 1 is firmly adsorbed and fixed by the adsorption surface S1. In this process, although the direction switch valve V12 and the cutoff valve V13 may be set to any position, in this case the direction switch valve V12 is switched to the right position in FIG. 5 and the cutoff valve V13 is switched to the open position for connection to the exhaust port EP so that the inner pressure of the pipes f14 and f16 becomes an atmospheric pressure.

At the same time, in the second piping system PS2, the direction switch valve V21 remains switched to the right position in FIG. 5 and the direction switch valve V22 is switched to the left position in the figure to connect the second flow channel F2 of the sample stage 11 to the intake pump P2 through the flow rate regulating valve V26 for smaller flow rates. Consequently, the adsorption surface S2 of the inner circumference stage IS also adsorbs and fixes the sample 1 in cooperation with the adsorption surface S1. Although the cutoff valve V23 may be set to any position, in this case it is switched to the open position for connection to the exhaust port EP so that the inner pressure of the pipe f25 becomes an atmospheric pressure.

In the third piping system PS3, the direction switch valves V31 and V51 remain switched to the left position in FIG. 5 to connect the third flow channel F3 of the sample stage 11 to the intake pump P2 through the flow rate regulating valve V36 for smaller flow rates. This prevents flotation of the inner circumference stage IS and fixes the inner circumference stage IS stably.

Although the cutoff valves V33 and V43 may be set to any position, in this case they are switched to the closed position to prevent the pipes downstream of the cutoff valves V33 and V43 from being pressurized.

—Step S20 (Step of Scanning the Sample)

After the sample 1 is adsorbed and held by the adsorption surfaces S1 and S2, the controller 40 drives the parallel movement stage 13 to move the stage device 10 from the sample delivery position Pa to the inspection start position Pb and perform scanning of the sample 1. In scanning the sample 1, the rotary stage 12 and parallel movement stage 13 are driven to move the sample 1 in the R direction toward the inspection completion position Pc while rotating it in the θ direction and the entire inspection surface of the sample 1 is spirally irradiated with the illumination light I1 and the inspection light I2 scattered or reflected by the sample 1 is detected. This Rθ scanning method is typically available in two types: CAV (Constant Angular Velocity) scan and CLV (Constant Linear Velocity) scan. CAV scan is a scanning method in which the rotation velocity (angular velocity) of the rotary stage 12 during scanning is constant. CLV scan is a scanning method in which the linear velocity (scanning velocity) is constant. After the stage device 10 arrives at the inspection completion position Pc and scanning is completed, the controller 40 stops the rotary stage 12 and drives the parallel movement stage 13 to move the stage device 10 to the sample delivery position Pa.

During scanning, in the first piping system PS1, the direction switch valves V41 and V11 remain switched to the left position in FIG. 5 to connect the first flow channel F1 of the sample stage 11 to the intake pump P2 through the flow rate regulating valve V15 for larger flow rates. Consequently, the sample 1 is firmly held by the adsorption surface S1 of the outer circumference stage OS even while the rotary stage 12 is rotating at high speed. In this process, although the direction switch valve V12 and cutoff valve V13 may be set to any position, in this case the direction switch valve V12 is switched to the right position in FIG. 5 and the cutoff valve V13 is switched to the open position for connection to the exhaust port EP so that the inner pressure of the pipes f14 and f16 becomes an atmospheric pressure.

At the same time, in the second piping system PS2, the direction switch valves V21 and V22 are switched to the right position in FIG. 5 and the cutoff valve V23 is switched to the closed position to keep the second flow channel F2 of the sample stage 11 at the holding pressure. Consequently, the adsorption surface S2 of the inner circumference stage IS continues to hold the sample 1 in cooperation with the adsorption surface S1 without applying an unnecessary external force to the center of the sample 1.

In the third piping system PS3, the direction switch valve V31 is switched to the left position in FIG. 5 and the direction switch valve V51 is switched to the right position to connect the third flow channel F3 of the sample stage 11 to the exhaust port EP. This suppresses an unnecessary external force applied to the center of the sample 1. Although the cutoff valves V33 and V43 may be set to any position, in this case they are switched to the closed position to prevent the pipes downstream of the cutoff valves V33 and V43 from being pressurized.

—Step S21 (Step of Releasing the Sample)

After the sample 1 arrives at the sample delivery position Pa, the controller 40 instructs the control valves to connect the first flow channel F1 to the air supply pump P1 so that air is supplied to between the first adsorption surface S1 and the sample 1 to peel off the sample 1 from the adsorption surface S1. In order to peel off the sample 1 from the adsorption surface S1, the direction switch valve V41 is switched to the right position in FIG. 5 and the cutoff valve V43 is switched to the open position to connect the first flow channel F1 of the sample stage 11 to the air supply pump P1 through the flow rate regulating valve V45 for smaller flow rates. The gas with a smaller flow rate is sent to between the first adsorption surface S1 and the sample 1 and at the subsequent step of moving up the inner circumference stage, the sample 1 is smoothly peeled off from the adsorption surface S1 and elevated. In this process, although the direction switch valves V11 and V12 and the cutoff valve V13 may be set to any position, in this case the direction switch valves V11 and V12 are switched to the right position in FIG. 5 and the cutoff valve V13 is switched to the open position for connection to the exhaust port EP. Consequently, the inner pressure of the pipes f12, f14, and f16 becomes an atmospheric pressure.

Meanwhile, in the second piping system PS2, the direction switch valves V21 and V22 remain switched to the right position in FIG. 5 and the cutoff valve V23 remains switched to the closed position to keep the second flow channel F2 of the sample stage 11 at the holding pressure. Consequently, the adsorption surface S2 of the inner circumference stage IS continues to hold the sample 1 without applying an unnecessary external force to the center of the sample 1.

In the third piping system PS3, the direction switch valve V31 is switched to the left position in FIG. 5 and the direction switch valve V51 is switched to the right position to connect the third flow channel F3 of the sample stage 11 to the exhaust port EP. Consequently, the external force except the own weight is removed from the inner circumference stage IS and the inner circumference stage IS becomes free from the outer circumference stage OS. Although the cutoff valves V33 and V43 may be set to any position, in this case they are switched to the closed position to prevent the pipes downstream of the cutoff valves V33 and V43 from being pressurized.

—Step S22 (Step of Moving Up the Inner Circumference Stage)

After the step of releasing the sample is carried out, the controller 40 instructs the control valves to connect the third flow channel F3 to the air supply pump P1 and move up the inner circumference stage IS to make it project from the outer circumference stage OS. To move up the inner circumference stage IS, in the third piping system PS3 the cutoff valve V33 is switched to the open position and the direction switch valve V31 is switched to the right position in FIG. 5 to connect the third flow channel F3 of the sample stage 11 to the air supply pump P1 through the flow rate regulating valve V35 for larger flow rates. This pressurizes the pressure receiving chamber C and quickly moves up the inner circumference stage IS with respect to the outer circumference stage OS.

Meanwhile, in the first piping system PS1, the direction switch valve V41 is switched to the left position in FIG. 5, the direction switch valves V11 and V12 are switched to the right position in the figure, and the cutoff valve V13 is switched to the open position to connect the first flow channel F1 of the sample stage 11 to the exhaust port EP. In the second piping system PS2, the direction switch valves V21 and V22 remain switched to the right position in FIG. 5 and the cutoff valve V23 is switched to the closed position to keep the second flow channel F2 of the sample stage 11 at the holding pressure. Consequently, the adsorption surface S2 of the inner circumference stage IS continues to hold the sample 1 without applying an unnecessary external force to the center of the sample 1. Although the direction switch valve V51 may be set to any position, in this case it is switched to the right position in FIG. 5 for connection to the exhaust port EP so that the pipes f33 and f51 have an atmospheric pressure. Also, although the cutoff valve V43 may be set to any position, in this case it is switched to the closed position to prevent the pipes downstream of the cutoff valve V43 from being pressurized.

—Step S23

After the inner circumference stage IS starts moving up, the controller 40 decides whether or not the inner circumference stage IS has arrived at the upper position (for example, the upper limit of the elevating range of the inner circumference stage IS). The controller 40 can make a decision as to whether the inner circumference stage IS has arrived at the upper position, for example, according to the height of the sample stage 11 measured by the sensor S. Also, when the increase in the volume of the pressure receiving chamber C with the ascent of the inner circumference stage IS stops and the pressure measured by the pressure sensor X3 exceeds a set value, it can be decided that the inner circumference stage IS has arrived at the upper position. The controller 40 continues Step S22 until the inner circumference stage IS arrives at the upper position and after the inner circumference stage IS arrives at the upper position, the sequence proceeds to the next step.

—Step S24 (Step of Taking Out the Sample)

After the inner circumference stage IS moves up to the upper position, the controller 40 instructs the transfer device 33 to lift the sample 1 from the inner circumference stage IS by inserting the claws CL of the arm Am in between the sample 1 lifted from the first adsorption surface S1 by the inner circumference stage IS and the adsorption surface S1.

Meanwhile, in the first piping system PS1, the direction switch valve V41 remains switched to the left position in FIG. 5, the direction switch valves V11 and V12 remain switched to the right position in the figure, and the cutoff valve V13 remains switched to the open position to connect the first flow channel F1 of the sample stage 11 to the exhaust port EP. In the second piping system PS2, the direction switch valves V21 and V22 are switched to the right position in the figure, and the cutoff valve V23 is switched to the open position to connect the second flow channel F2 of the sample stage 11 to the exhaust port EP. Consequently, the adsorption by the second adsorption surface S2 is eliminated and the sample 1 is released. In the third piping system PS3, the cutoff valve V33 remains switched to the open position and the direction switch valve V31 remains switched to the right position in FIG. 5 to keep the inner circumference stage IS at the upper position. Although the cutoff valve V43 may be set to any position, in this case it is switched to the closed position to prevent the pipes downstream of the cutoff valve V43 from being pressurized. Although the direction switch valve V51 may be set to any position, in this case it is switched to the right position in FIG. 5 for connection to the exhaust port EP so that the pipes f33 and f51 have an atmospheric pressure.

After that, the controller 40 further instructs the transfer device 33 to put the sample 1 unloaded from the sample stage 11, for example, in the pod. The inspection process for one sample 1 is thus completed. The controller 40 replaces the sample 1 according to an instruction from the operator and repeats the above steps.

<Sample Correcting Operation>

Figure 11:
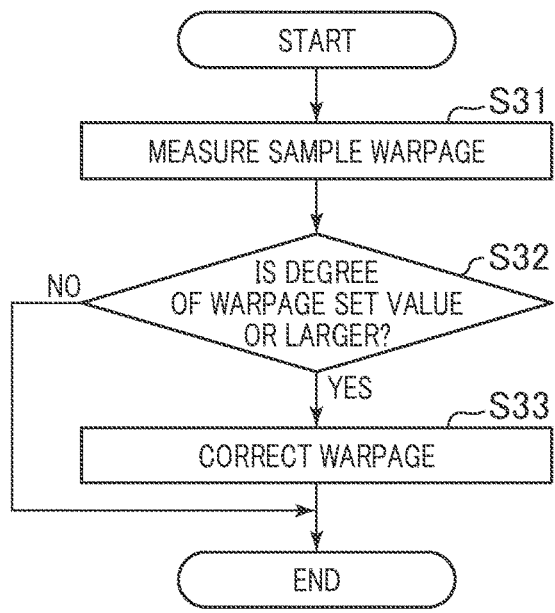
FIG. 11 is a flowchart that indicates the control sequence for sample correcting operation.

FIG. 11 is a flowchart that indicates the control sequence for sample correcting operation by the controller. The control described below is performed when the CPU 44 outputs a command signal to the pneumatic system (control valves, air supply pump P1 and intake pump P2).

As explained above, the adsorption surface S1 of the outer circumference stage OS and the adsorption surface S2 of the inner circumference stage IS can each suck or discharge air and control its flow rate independently of the flow channels F1 and F2. Taking advantage of this feature, if the degree of warpage of the sample 1 is a set value or larger, the controller 40 can instruct the control valves to reduce the warpage of the sample 1 to correct the warpage of the sample 1 before scanning, as necessary.

—Step S31

First, the controller 40 measures the degree of warpage of the sample 1. The degree of warpage can be measured, for example, by the sensor S. For example, the stage device 10 has a mechanism to drive the sample stage 11 in the Z axis direction (vertical direction) and during scanning of the sample 1, the auto-focus functions. Specifically, the height of the sample stage 11 is controlled so that the height of the sample 1 as detected by the sensor S (illumination position of the illumination light I1) is constant. The coordinates (R, Z) of the sample stage 11 at this moment correspond to the surface shape of the sample 1 in the radial direction (R direction). As for the surface shape of the sample 1, by comparing the coordinates (R, Z) of two points exceeding a prescribed value in height difference, data concerning not only the degree of warpage but also whether the sample 1 warps upward or downward in a convex form can be obtained.

Instead of using the auto-focus function, after the step of adsorbing the sample (Step S17), the step of measuring the surface shape of the sample 1 may be added before the step of operating the sample (Step S20). For example, the parallel movement stage 13 can be driven from the inspection start position Pb to the inspection completion position Pc while the rotary stage 12 is rotated as necessary so that the value measured by the sensor X at this moment is recorded to obtain data along the radial direction about the surface height of the sample 1.

If the sample 1 warps upward in a convex form and the degree of adhesion to the sample stage 11 is lower in the center area than in the circumferential area, the value measured by the pressure sensor X2 in FIG. 5 may be higher than a prescribed level. On the other hand, if the sample 1 warps downward in a convex form and the degree of adhesion is lower in the circumferential area than in the center area, the value measured by the pressure sensor X1 in FIG. 5 may be higher than a prescribed level. Therefore, the shape of warpage of the sample 1 may be determined on the basis of the values measured by the pressure sensors X1 and X2. By setting thresholds (set values) for the values measured by the pressure sensors X1 and X2, for example, if the value measured by the pressure sensor X1 (for example, the measured value at the time of completion of Step S17 in FIG. 7) exceeds the threshold, it can be determined that the sample 1 warps downward in a convex form beyond a prescribed level. On the other hand, if the value measured by the pressure sensor X2 exceeds the threshold, it can be determined that the sample 1 warps upward in a convex form beyond a prescribed level.

—Step S32

After the degree of warpage of the sample 1 is measured, the controller 40 decides whether or not the degree of warpage (absolute value) is a set value (>0) or larger. The controller 40 ends the step if the degree of warpage is smaller than the set value. In this case, warpage correction of the sample 1 is not made and the controller 40 controls opening and closing of the control valves as described about Step S20 in FIG. 7 to scan the sample 1. On the other hand, if the degree of warpage is the set value or larger, the controller 40 proceeds to the next step S33.

—Step S33

If the warpage of the sample 1 is the set value or larger, the controller 40 instructs the control valves to decrease the degree of warpage of the sample 1 (correct the warpage) to correct the warpage of the sample 1 and ends the sequence in FIG. 11.

At Step S33, if the sample 1 warps downward in a convex form and the degree of warpage is the set value or larger, the adsorption force of the first adsorption surface S1 is increased. In this case, for example, assuming that the control valves are set as explained about the step of scanning the sample (Step S20) in FIG. 7, if the intake pump P2 is a variable displacement pump, the intake air flow rate may be increased to the set value. The intake air flow rate can also be increased, for example, by connecting an additional flow rate regulating valve for setting larger flow rates than the flow rate regulating valve V15 in parallel with the flow rate regulating valve V15 so that when scanning the sample, the first flow channel F1 and intake pump P2 are connected through the additional flow rate regulating valve. Consequently, the adsorption force of the first adsorption surface S1 is increased and the warpage of the sample 1 is decreased.

On the other hand, if the sample 1 warps upward in a convex form and the degree of warpage is the set value or larger, the adsorption force of the second adsorption surface S2 is increased. In this case, for example, assuming that the control valves are set as explained about the step of scanning the sample (Step S20) in FIG. 7, the direction switch valve V21 may be switched to the left position in FIG. 5 to connect the second flow channel F2 to the intake pump P2 through the flow rate regulating valve V25 for larger flow rates. Consequently, the adsorption force of the second adsorption surface S2 is increased and the warpage of the sample 1 is reduced.

The time to carry out Step S33 varies depending on the time to determine the degree of warpage. For example, if the degree of warpage is determined on the basis of data on auto focus operation of the sample stage 11 during scanning, since it is during scanning that the degree of warpage of the sample 1 is found to be the set value or larger, Step S33 can be carried out during scanning of the sample. On the other hand, if the warpage of the sample 1 is determined by the sensor S before scanning the sample or if it is determined from the values measured by the pressure sensors X1 and X2 when the sample stage 11 holds the sample 1, it is before scanning that the degree of warpage of the sample 1 is found to be the set value or larger. In these cases, Step S33 can be carried out before starting scanning of the sample, so scanning can be started with the sample 1 whose flatness has been increased by correction.

Effects (1) In this embodiment, the sample stage 11 comprises the inner circumference stage IS and the outer circumference stage OS and the inner circumference stage IS moves up with respect to the outer circumference stage OS. Consequently, first the inner circumference stage IS, which projects upward and has a smaller diameter, receives the center area of the sample 1 and then the inner circumference stage IS moves down so that the entire surface of the sample 1 can be adsorbed by a wide adsorption surface that combines the adsorption surface S2 of the inner circumference stage IS and the adsorption surface S1 of the outer circumference stage OS. Therefore, even when the Re method optical inspection device 100 that rotates the sample 1 at high speed during scanning is adopted, undulation of the circumference of the sample 1 can be suppressed and the flatness of the sample 1 during high speed rotation (scanning) can be improved and the inspection sensitivity can be increased while high inspection efficiency is maintained. In addition, since the inner circumference stage IS has an opening for sucking the sample and can adsorb the sample 1 by itself, the sample 1 can be stably moved up and down.
(2) Since the outer circumference stage OS and the inner circumference stage IS are concentric and the center of the inner circumference stage IS coincides with the rotation center of the sample stage 11 and the center of the sample 1, the center of the sample 1 can be uniformly supported by the adsorption surface S2 of the inner circumference stage IS. Consequently, the sample 1 can be stably moved up and down in loading and unloading and the adsorption force of the inner circumference stage IS can be applied to the center of the sample 1. When a thin sample 1 is partially adsorbed, a microscopic recess may be generated in the sucked area of the sample 1, but since the area is in the center of the sample 1, the influence of microscopic deformation on rotational balance during high speed rotation can be suppressed.
(3) Although the inner circumference stage IS moves up and down, the adsorption surface S1 of the outer circumference stage OS and the adsorption surface S2 of the inner circumference stage IS can be made flush without a height difference. Since the adsorption surfaces S1 and S2 can be on the same plane, even when the sample 1 is adsorbed by the adsorption surfaces S1 and S2 at the same time, there is no possibility that a high surface pressure might be locally applied to the sample 1 due to an adsorption surface height difference.
(4) Since the openings of the flow channels F1 and F2 are arranged rotationally symmetrically with respect to the rotation center of the sample stage 11, the influence on rotational balance of the sample 1 can also be suppressed.
(5) The outside diameter of the inner circumference stage IS is smaller than the distance between the two claws CL of the arm Am of the transfer device 33 and the outside diameter of the outer circumference stage OS is larger than it. Consequently, in the optical inspection device 100 that transfers the sample 1 using the arm Am since the sample stage 11 rotates, as explained above, the inner circumference stage IS with the smaller diameter temporarily receives the sample 1 and supports the sample 1 entirely in cooperation with the outer circumference stage OS with the larger diameter.
(6) Since the piping systems PS1 to PS3 are connected independently to the flow channels F1 to F3 and the flow channels of the piping systems PS1 to PS3 are individually switched using the control valves, operation to suck or discharge air on the first adsorption surface S1, operation to suck or discharge air on the second adsorption surface S2 and ascent/descent of the inner circumference stage IS can be performed independently. Consequently, operation to suck or discharge air can be performed not only on both the adsorption surfaces S1 and S2, but also it is possible that, for example, the air is sucked on the first adsorption surface S1 and the air is discharged on the second adsorption surface S2.
(7) Since operation to suck or discharge air on the first adsorption surface S1, operation to suck or discharge air on the second adsorption surface S2, and ascent or descent of the inner circumference stage IS can be performed independently, the step of setting the sample (Step S14), the step of moving down the inner circumference stage IS (Step S15) and the step of adsorbing the sample (Step S17) can be performed. By taking these steps, in the Re method optical inspection device 100, the sample stage 11 can adsorb and hold the entire surface of the sample 1 using the arm Am.
(8) Furthermore, by sucking the air from between the first adsorption surface S1 and the sample 1 approaching it at the step of moving down the inner circumference stage (Step S15), the air resistance can be reduced so that the sample 1 can land on the first adsorption surface S1 smoothly.
(9) Since operation to suck or discharge air on the first adsorption surface S1, operation to suck or discharge air on the second adsorption surface S2, and ascent/descent of the inner circumference stage IS can be performed independently, the step of moving up the inner circumference stage (Step S22) and the step of taking out the sample (Step S24) can be performed. By taking these steps, in the Re method optical inspection device 100, the sample stage 11 can pick up and collect the sample 1 entirely supported by the sample stage 11.
(10) Furthermore, since the sample releasing step to supply air to between the first adsorption surface S1 and the sample 1 (Step S21) is performed before the step of moving up the inner circumference stage (Step S22), the sample 1 can be smoothly lifted from the first adsorption surface S1. Although a wafer or the like has a mirror surface and hardly peels off from the first adsorption surface S1, the sample 1 is smoothly peeled off from the first adsorption surface S1 by supplying a small amount of air to between the first adsorption surface S1 and the sample 1.
(11) Since operation to suck or discharge air on the first adsorption surface S1, operation to suck or discharge air on the second adsorption surface S2, and ascent/descent of the inner circumference stage IS can be performed independently, warpage of the sample 1 can be corrected as necessary by controlling the control valves as explained above. If the warpage is corrected in conjunction with the auto focus function during scanning, it is advantageous in terms of efficiency and if the warpage is evaluated before scanning and operation is performed after correction, it is advantageous in terms of inspection accuracy.

Second Embodiment

Figure 12:
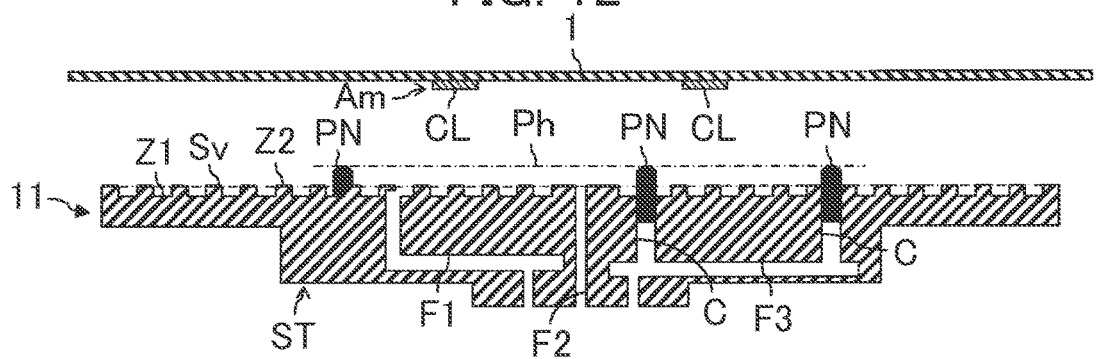
FIG. 12 is a sectional view of the sample stage of the optical inspection device according to a second embodiment of the present invention, including the rotation center.
Figure 13:
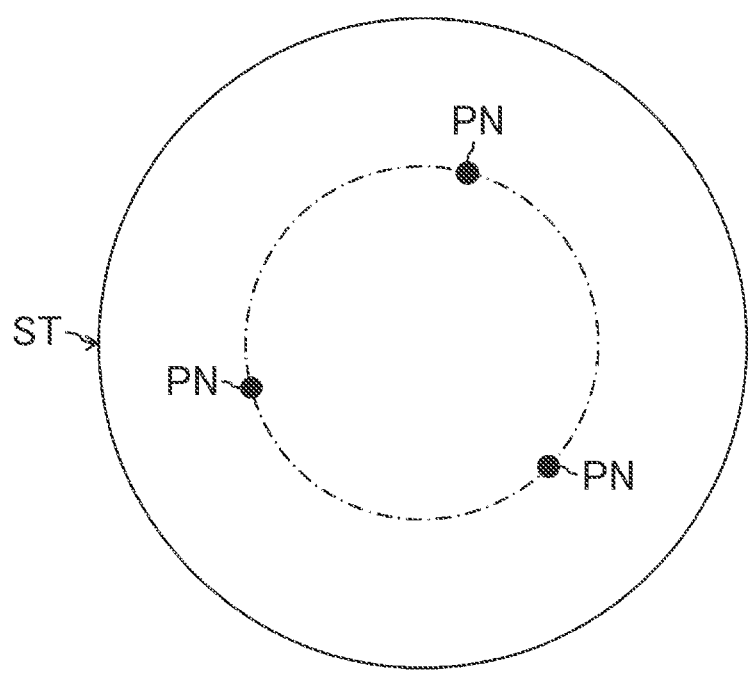
FIG. 13 is a plan view of the sample stage in FIG. 12.

FIG. 12 is a sectional view of the sample stage 11 including the rotation center and FIG. 13 is a plan view of the sample stage 11. In FIG. 12 and FIG. 13, the elements that are the same as or equivalent to those in the first embodiment are designated by the same reference signs as in FIG. 4 and their description is omitted. This embodiment is different from the first embodiment in that a plurality of (preferably three) elevating pins PN are provided instead of the inner circumference stage IS. The sample stage 11 in this embodiment has a plurality of pin holes extending vertically in a stage ST equivalent to the outer circumference stage OS in the first embodiment and one elevating pin PN is housed in each pin hole in a vertically movable manner. The elevating pins PN do not have an air intake opening like the one in the inner circumference stage IS and do not have the function to adsorb the sample 1. Each pin hole is connected to the third flow channel F3 to constitute the pressure receiving chamber C, and when it is pressurized with air, each elevating pin PN moves up and projects upward from an adsorption surface Sv of the stage ST and when the pressure becomes an atmospheric pressure or lower, each elevating pin PN moves down and is housed in the pin hole. With each elevating pin PN housed in the pin hole, the upper end of the elevating pin PN is lower than the adsorption surface Sv, and with the elevating pin moved up, it is tangent to a virtual horizontal plane Ph. These elevating pins PN are arranged rotationally symmetrically with respect to the center of the adsorption surface Sv (namely the rotation center of the sample stage 11). The other elements are the same as in the first embodiment.

In this embodiment, the steps of loading and unloading the sample 1 are almost the same as in the first embodiment, but since the elevating pins PN do not have the adsorption function, only switching of the control valves in performing Steps S14 and S15 in FIG. 7 is different. Steps S14 and S15 in this embodiment are explained below.

—Step S14 (Step of Setting the Sample)

In this embodiment, operation of the transfer device 33 to set the sample 1 on the elevating pins PN moved up to the upper position at Step S14 in FIG. 7 is not different from that in the first embodiment, but since the elevating pins PN do not have the adsorption function, the second flow channel F2 is connected not to the intake pump P2 but to the exhaust port EP. What is different in switching of the control valves in performing Step S14 is only how the direction switch valves V21 and V22 and the cutoff valve S23 are switched. In this embodiment, the controller 40 switches the direction switch valves V21 and V22 to the right position in FIG. 5 and switches the cutoff valve V23 to the open position to connect the second flow channel F2 to the exhaust port EP. Consequently, the inner pressure of the pipes f21, f23, and f25 becomes an atmospheric pressure.

—Step S15 (Step of Moving Down the Inner Circumference Stage)

At Step S15 too, the second flow channel F2 is connected not to the intake pump P2 but to the exhaust port EP. What is different in switching of the control valves in performing Step S14 is only how the direction switch valves V21 and V22 and the cutoff valve S23 are switched. In this embodiment, after Step S14 the controller 40 holds the direction switch valves V21 and V22 switched to the right position in FIG. 5 and the cutoff valve V23 switched to the open position to connect the second flow channel F2 to the exhaust port EP. Consequently, the inner pressure of the pipes f21, f23, and f25 becomes an atmospheric pressure.

In this embodiment too, since the elevating pins PN temporarily receive the sample 1 and then move down it onto the wide adsorption surface Sv, even when applied to the Re method optical inspection device 100 in which the sample 1 is rotated at high speed during scanning, undulation of the circumference of the sample 1 can be suppressed. This improves the flatness of the sample 1 during high speed rotation (scanning) and increases the inspection sensitivity while maintaining a high inspection efficiency. As for the other points too, the same effects as those of the first embodiment can be achieved except the effect related to the adsorption function of the inner circumference stage IS in the first embodiment.

LIST OF REFERENCE SIGNS

1 . . . sample,
11 . . . sample stage,
12 . . . rotary stage,
13 . . . parallel movement stage,
33 . . . transfer device,
40 . . . controller,
Am . . . arm,
C . . . pressure receiving chamber,
CL . . . claw,
EP . . . exhaust port,
F1 . . . first flow channel,
F2 . . . second flow channel,
F3 . . . third flow channel,
IS . . . inner circumference stage,
OS . . . outer circumference stage,
P1 . . . air supply pump,
P2 . . . intake pump,
PS1 . . . first piping system,
PS2 . . . second piping system,
PS3 . . . third piping system,
S . . . sensor,
S1 . . . first adsorption surface,
S2 . . . second adsorption surface,
S14 . . . setting step,
S15 . . . moving down step,
S17 . . . adsorption step,
S22 . . . moving up step,
S24 . . . taking out step,
S21 . . . releasing step,
V11, V12 . . . direction switch valves (first direction switch valves),
V21, V22 . . . direction switch valves (second direction switch valves),
V31 . . . direction switch valve (third direction switch valve)

The invention claimed is:

1. A sample stage that adsorbs and holds a sample, comprising:
an outer circumference stage that has a first adsorption surface, a pressure receiving chamber as a recess formed in a center thereof, and a first guide;
an inner circumference stage that has a second adsorption surface and that is housed in the pressure receiving chamber and can project upward from the outer circumference stage;
a first flow channel for sample loading/unloading operation that is formed in the outer circumference stage and is open into the first adsorption surface;
a second flow channel for sample loading/unloading operation that is formed in the outer circumference stage and the inner circumference stage and is open into the second adsorption surface;

a third flow channel for inner circumference stage elevating driving that is formed in the outer circumference stage and is open into the pressure receiving chamber; and a second guide is located under the inner circumference stage; wherein the first guide is cylindrical, extends upward from a bottom of the pressure receiving chamber to a middle portion of the pressure receiving chamber, and has a gap between its upper surface and the first adsorption surface, and the second guide is cylindrical and concave and slides over the first guide to guide ascending and descending of the inner circumference stage with respect to the outer circumference stage.

2. The sample stage according to claim 1, wherein the outer circumference stage and the inner circumference stage are formed concentrically in a plan view.

3. The sample stage according to claim 1, wherein a height position for the outer circumference stage at which the first adsorption surface and the second adsorption surface are flush is included in an elevating range of the inner circumference stage.

4. The sample stage according to claim 1, wherein the first flow channel has a plurality of openings into the first adsorption surface and the second flow channel has at least one opening into the second adsorption surface, and the plurality of openings into the first adsorption surface and the at least one opening into the second adsorption surface are arranged symmetrically around a center of the second adsorption surface.

5. An optical inspection device comprising:
the sample stage according to claim 1;
a rotary stage that supports the sample stage;
a parallel movement stage that supports the rotary stage; and
a transfer device that transfers a sample to the sample stage using an arm, wherein
the arm is fork-shaped with two claws, and
an outside diameter of the inner circumference stage is smaller than a distance between the two claws and an outside diameter of the outer circumference stage is larger than the distance.

6. An optical inspection device comprising:
a sample stage that adsorbs and holds a sample, the sample stage includes:
an outer circumference stage that has a first adsorption surface and a pressure receiving chamber as a recess formed in a center thereof,
an inner circumference stage that has a second adsorption surface and that is housed in the pressure receiving chamber and can project upward from the outer circumference stage,
a first flow channel for sample loading/unloading operation that is formed in the outer circumference stage and is open into the first adsorption surface,
a second flow channel for sample loading/unloading operation that is formed in the outer circumference stage and the inner circumference stage and is open into the second adsorption surface, and
a third flow channel for inner circumference stage elevating driving that is formed in the outer circumference stage and is open into the pressure receiving chamber;
a rotary stage that supports the sample stage;
a parallel movement stage that supports the rotary stage;
a transfer device that transfers a sample to the sample stage using an arm, wherein
the arm is fork-shaped with two claws, and
an outside diameter of the inner circumference stage is smaller than a distance between the two claws and an outside diameter of the outer circumference stage is larger than the distance;
an air supply pump;
an intake pump;
an exhaust port open to an atmospheric air;
a first piping system for sample loading/unloading on the first adsorption surface that connects the intake pump and the exhaust port to the first flow channel;
a second piping system for sample loading/unloading on the second adsorption surface that connects the intake pump and the exhaust port to the second flow channel;
a third piping system for moving up and down the inner circumference stage that connects the air supply pump and the intake pump to the third flow channel; and
control valves that control a fluid flowing in the first piping system, the second piping system, and the third piping system, wherein
the control valves include:
at least one first direction switch valve that is installed in the first piping system and switches the object to be connected to the first flow channel between the intake pump and the exhaust port;
at least one second direction switch valve that is installed in the second piping system and switches the object to be connected to the second flow channel between the intake pump and the exhaust port; and
at least one third direction switch valve that is installed in the third piping system and switches the object to be connected to the third flow channel between the air supply pump and the exhaust port.

7. The optical inspection device according to claim 6, comprising:
a controller that controls the transfer device and the control valves, wherein
the controller performs a sample loading sequence including:
a setting step of instructing the control valves to connect the first flow channel to the exhaust port, connect the second flow channel to the intake pump, and connect the third flow channel to the air supply pump and instructing the transfer device to place a sample on the inner circumference stage projecting from the outer circumference stage;
a moving down step of instructing the control valves to connect the third flow channel to the intake pump and moving down the inner circumference stage; and
an adsorption step of instructing the control valves to connect the first flow channel and the second flow channel to the intake pump and adsorbing and holding the sample by the first adsorption surface and the second adsorption surface.

8. The optical inspection device according to claim 7, wherein at the moving down step the controller instructs the control valves to connect the first flow channel to the intake pump and suck air from between the first adsorption surface and the sample approaching the first adsorption surface.

9. The optical inspection device according to claim 6, comprising a controller that controls the transfer device and the control valves, wherein
the controller performs a sample unloading sequence including:

a moving up step of instructing the control valves to connect the third flow channel to the air supply pump and moving up the inner circumference stage to make it project from the outer circumference stage; and a taking out step of instructing the transfer device to insert the arm between a sample lifted from the first adsorption surface by the inner circumference stage and the first adsorption surface and lift the sample from the inner circumference stage.

10. The optical inspection device according to claim 9, wherein the sample unloading sequence includes, before the moving up step, a releasing step of instructing the control valves to connect the first flow channel to the air supply pump and supplying air to between the first adsorption surface and the sample.

11. The optical inspection device according to claim 6, comprising:

a sensor that measures a degree of warpage of a sample; and a controller that controls the control valves, wherein the controller instructs the control valves to decrease the degree of warpage of the sample if the degree of warpage of the sample is a set value or larger.

\* \* \* \* \*